(12) United States Patent
Chan

(10) Patent No.: US 12,174,498 B1
(45) Date of Patent: Dec. 24, 2024

(54) DISPLAY DEVICE

(71) Applicant: Himax Display, Inc., Tainan (TW)

(72) Inventor: Shu-Chuan Chan, Tainan (TW)

(73) Assignee: Himax Display, Inc., Tainan (TW)

( * ) Notice: Subject to any disclaimer, the term of this patent is extended or adjusted under 35 U.S.C. 154(b) by 0 days.

(21) Appl. No.: 18/522,282

(22) Filed: Nov. 29, 2023

(51) Int. Cl.
*G02F 1/1345* (2006.01)
*H05K 1/18* (2006.01)

(52) U.S. Cl.
CPC ......... *G02F 1/13458* (2013.01); *H05K 1/189* (2013.01); *H05K 2201/10136* (2013.01)

(58) Field of Classification Search
None
See application file for complete search history.

(56) References Cited

U.S. PATENT DOCUMENTS

| 2019/0101782 A1* | 4/2019 | Cao .................. G02F 1/133305 |
| 2021/0048701 A1* | 2/2021 | Chen .................... G02F 1/1337 |
| 2021/0325714 A1* | 10/2021 | Shin .................. G02F 1/136222 |

* cited by examiner

*Primary Examiner* — Richard H Kim
(74) *Attorney, Agent, or Firm* — JCIPRNET

(57) ABSTRACT

A display device including a display panel and a flexible printed circuit is provided. The display panel includes a pad and has a light-emitting surface and a back surface opposite to each other. The pad is disposed on the back surface. The flexible printed circuit is bonded on the pad of the display panel, wherein the display panel is electrically connected to the flexible printed circuit.

12 Claims, 4 Drawing Sheets

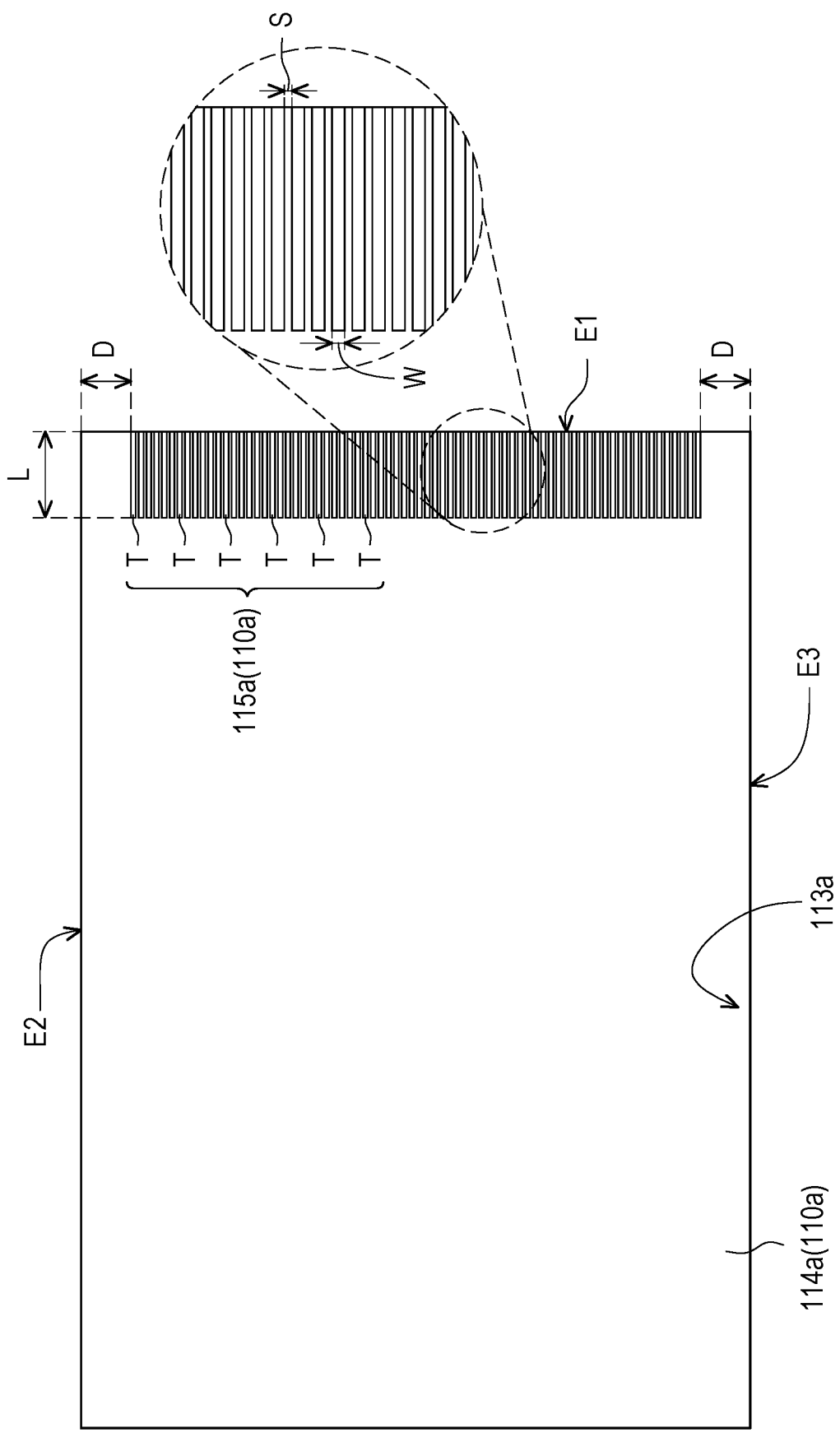

DISPLAY DEVICE

BACKGROUND

Technical Field

The present invention relates to an optical device, and more particularly to a display device.

Description of Related Art

In the currently liquid crystal on silicon device includes a liquid crystal on silicon panel and a flexible printed circuit electrically coupled to the liquid crystal on silicon panel for transferring image signals to the liquid crystal on silicon panel in order to display an image. In order to bond with the flexible printed circuit, the upper substrate and the lower substrate of the liquid crystal on silicon panel are arranged in an offset manner, and part of the lower substrate is exposed to provide bonding pads. The lower substrate is exposed by the upper substrate to at least 1 mm of pad installation space. Hence, the bonding pad is usually disposed on the front surface of the liquid crystal on silicon panel, and the flexible printed circuit is electrically connected to the liquid crystal on silicon panel through the bonding pad. However, the above-mentioned conventional design makes the integral volume of the liquid crystal on silicon device unable to be effectively downsized and thereby the liquid crystal on silicon device fails to meet the requirement of micronization.

SUMMARY

An embodiment of the disclosure provides display device with a smaller size.

A display device according to an embodiment of the disclosure includes a display panel and a flexible printed circuit. The display panel includes a pad and has a light-emitting surface and a back surface opposite to each other. The pad is disposed on the back surface. The flexible printed circuit is bonded on the pad of the display panel, wherein the display panel is electrically connected to the flexible printed circuit.

In an embodiment of the disclosure, the display panel further includes an upper substrate and a lower substrate. The upper substrate has the light-emitting surface, and the lower substrate has the back surface. The lower substrate completely overlaps the upper substrate.

In an embodiment of the disclosure, the display panel further includes an upper substrate, a first lower substrate and a second lower substrate. The upper substrate has the light-emitting surface, the first lower substrate is located between the second lower substrate and the upper substrate, and the second lower substrate has the back surface. The first lower substrate and the second lower substrate completely overlap the upper substrate.

In an embodiment of the disclosure, a first thickness of the first lower substrate is grated than a second thickness of the second lower substrate.

In an embodiment of the disclosure, the first thickness is between 0.3 mm and 0.73 mm.

In an embodiment of the disclosure, the second thickness is between 0.05 mm and 0.1 mm.

In an embodiment of the disclosure, the pad of the display panel includes a plurality of terminals separated from each other, and the plurality of terminals extend inwardly by a length from a side edge of the back surface.

In an embodiment of the disclosure, the length is between 0.5 mm and 1.5 mm.

In an embodiment of the disclosure, a width of each of the plurality of the terminals is between 0.0.3 mm and 0.15 mm.

In an embodiment of the disclosure, a spacing between any two adjacent terminals is between 0.01 mm and 0.05 mm.

In an embodiment of the disclosure, the pad of the display panel is spaced apart from an upper edge and a lower edge that are vertically connected to the side edge of the back surface by a distance of 0.2 mm to 0.8 mm, respectively.

In an embodiment of the disclosure, the display panel comprises liquid crystal on silicon panel.

In an embodiment of the disclosure, the display device further includes an anisotropic conductive film disposed between the pad of the display panel and the flexible printed circuit, wherein the flexible printed circuit is bonded to and electrically connected to the pad through the anisotropic conductive film.

Based on the foregoing, in the design of the display device of the disclosure, the pad of the display panel is disposed on the back surface, and the flexible printed circuit is bonded on the pad and electrically connected to the display panel. Compared with the conventional technology in which the pad of the display panel is disposed on the front surface, the design of the display device according to the embodiments of the disclosure can effectively reduce the size, so that the display device can have a smaller size.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 1C is a schematic bottom view of a display panel in display device of FIG. 1A.

DESCRIPTION OF THE EMBODIMENTS

The embodiments of the disclosure may be understood together with the drawings, and the drawings of the disclosure are also regarded as a part of the disclosure. It should be understood that the drawings of the disclosure are not drawn to scale and, in fact, the dimensions of elements may be arbitrarily expanded or reduced in order to clearly represent the features of the disclosure.

Figure 1A:
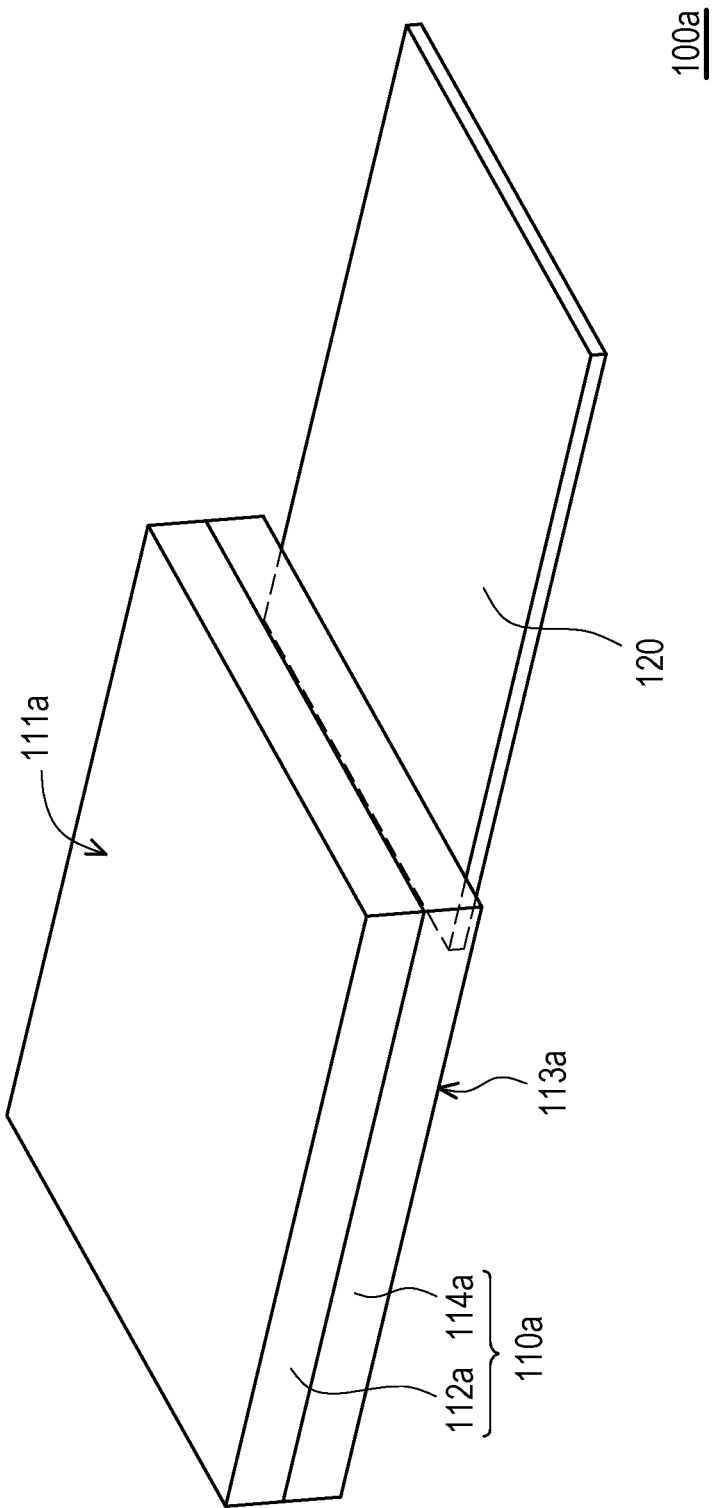
FIG. 1A is a three-dimensional schematic view of a display device according to an embodiment of the disclosure.
Figure 1B:
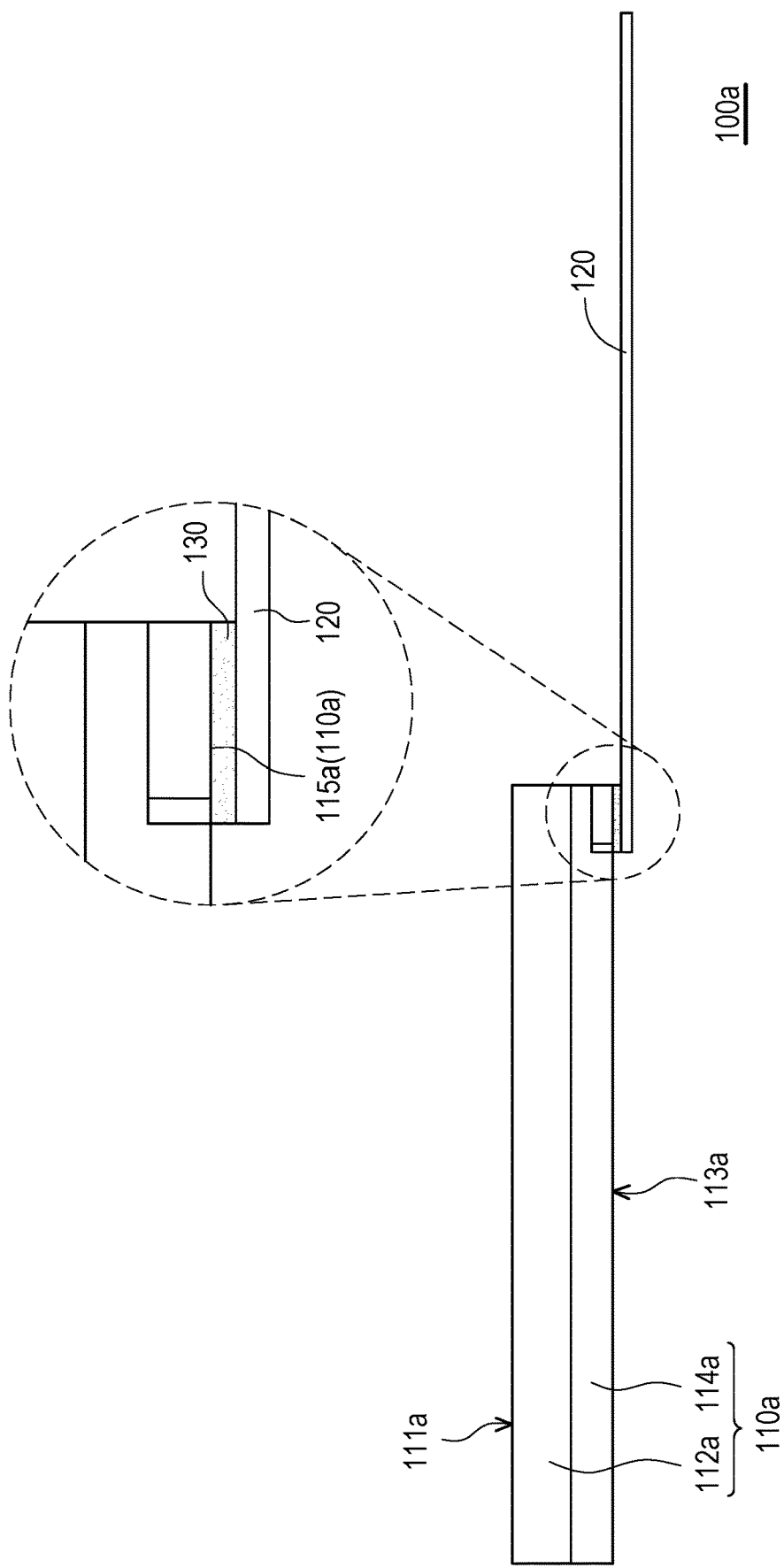
FIG. 1B is a schematic side view of the display device of FIG. 1A.

FIG. 1A is a three-dimensional schematic view of a display device according to an embodiment of the disclosure. FIG. 1B is a schematic side view of the display device of FIG. 1A. FIG. 1C is a schematic bottom view of a display panel in display device of FIG. 1A.

Referring to FIG. 1A, FIG. 1B and FIG. 1C at the same time. In the embodiment, the display device 100a includes a display panel 110a and a flexible printed circuit 120. The display panel 110a includes a pad 115a and has a light-emitting surface 111a and a back surface 113a opposite to each other. The pad 115a is disposed on the back surface 113a. The flexible printed circuit 120 is bonded on the pad 115a of the display panel 110a, wherein the display panel 110a is electrically connected to the flexible printed circuit 120.

In detail, in the present embodiment, the display panel 110a further includes an upper substrate 112a and a lower substrate 114a. The upper substrate 112a has the light-emitting surface 111a, and the lower substrate 114a has the back surface 113a. The lower substrate 114a completely overlaps the upper substrate 112a, and there is no misalignment between the upper substrate 112a and the lower substrate 114a. The size of the lower substrate 114a is the same as the size of the upper substrate 112a. Herein, the dimensions include length and width, but the embodiment is not limited thereto. In the present embodiment, the peripheral edge of the lower substrate 114a is completely aligned with the peripheral edge of the upper substrate 112a. In one embodiment, a thickness of the lower substrate 114a, for example, is between 1.46 mm and 0.35 mm.

In one embodiment, the pad 115a can be embedded in the back surface 113a of the lower substrate 114a. In one embodiment, the pad 115a can be protruded from the back surface 113a of the lower substrate 114a. In one embodiment, the upper substrate 112a of the display panel 110a, for example, is single layer of pure ITO glass substrate or multi-layers coated ITO (i.e. IMITO) glass substrate, and the lower substrate 114a of the display panel 110a, for example, is a CMOW substrate coated with liquid crystal silicon. In the present embodiment, the display panel 110a is, for example, a liquid crystal on silicon panel. The liquid crystal on silicon panel is a display panel manufactured by using a silicon wafer as a substrate, and the liquid crystal on silicon panel is a reflective display panel. A pixel electrode of the liquid crystal on silicon panel is manufactured with a non-light-transmissive metal material, and since the metal pixel electrode almost covers the entire pixel area, the liquid crystal on silicon panel can utilize a light source more efficiently to enhance a brightness of a display frame.

Please refer to FIG. 1C again. In the present embodiment, the pad 115a of the display panel 110a includes a plurality of terminals T separated from each other, and the plurality of terminals T extend inwardly by a length L from a side edge E1 of the back surface 113a. Herein, the length L, for example, is between 0.5 mm and 1.5 mm. A width W of each of the plurality of the terminals T, for example, is between 0.0.3 mm and 0.15 mm. A spacing S between any two adjacent terminals T, for example, is between 0.01 mm and 0.05 mm. In addition, the pad 115a of the display panel 110a is spaced apart from an upper edge E2 and a lower edge E3 that are vertically connected to the side edge E1 of the back surface 113a by a distance D of 0.2 mm to 0.8 mm, respectively.

Please refer to FIG. 1B again. In the present embodiment, the display device 100a further includes an anisotropic conductive film 130 disposed between the pad 115a of the display panel 110a and the flexible printed circuit 120, wherein the flexible printed circuit 120 is bonded to and electrically connected to the pad 115a through the anisotropic conductive film 130. In one present embodiment, the anisotropic conductive film includes a base material and a plurality of conductive particles dispersed in the base material. Before the anisotropic conductive film is pressurized (i.e., before bonding the flexible printed circuit one the pad), the conductive particles are arrayed in the base material, and the conductive particles do not form a conductive path. After the anisotropic conductive film is pressurized (i.e., after bonding the flexible printed circuit on the pad), the conductive particles in a pressurized direction may contact each other to form a conductive path in the pressurized direction.

It is worth mentioning that by changing the size design of the terminals (including length, width, spacing or quantity, etc.), the contact area with the anisotropic conductive film 130 can be increased to increase the conductivity and current resistance, and avoid burn out issues due to large currents.

In brief, in the design of the display device 100a of the embodiment, the pad 115a of the display panel 110a is disposed on the back surface 113a, and the flexible printed circuit 120 is bonded on the pad 115a and electrically connected to the display panel 110a. Compared with the conventional technology in which the pad of the display panel is disposed on the front surface, the design of the display device 100a according to the embodiments does not need to reserve the pad space in a staggered manner on the front surface of the display panel, so the display device 100a can effectively reduce the size and can have a smaller size.

It should be noted here that the following embodiments continue to adopt the reference numbers and part of the content of the previous embodiments, wherein the same numbers are used to represent the same or similar components, and the description of the same technical content is omitted. For the description of omitted parts, reference may be made to the foregoing embodiments, and the following embodiments will not be repeated.

Figure 2:
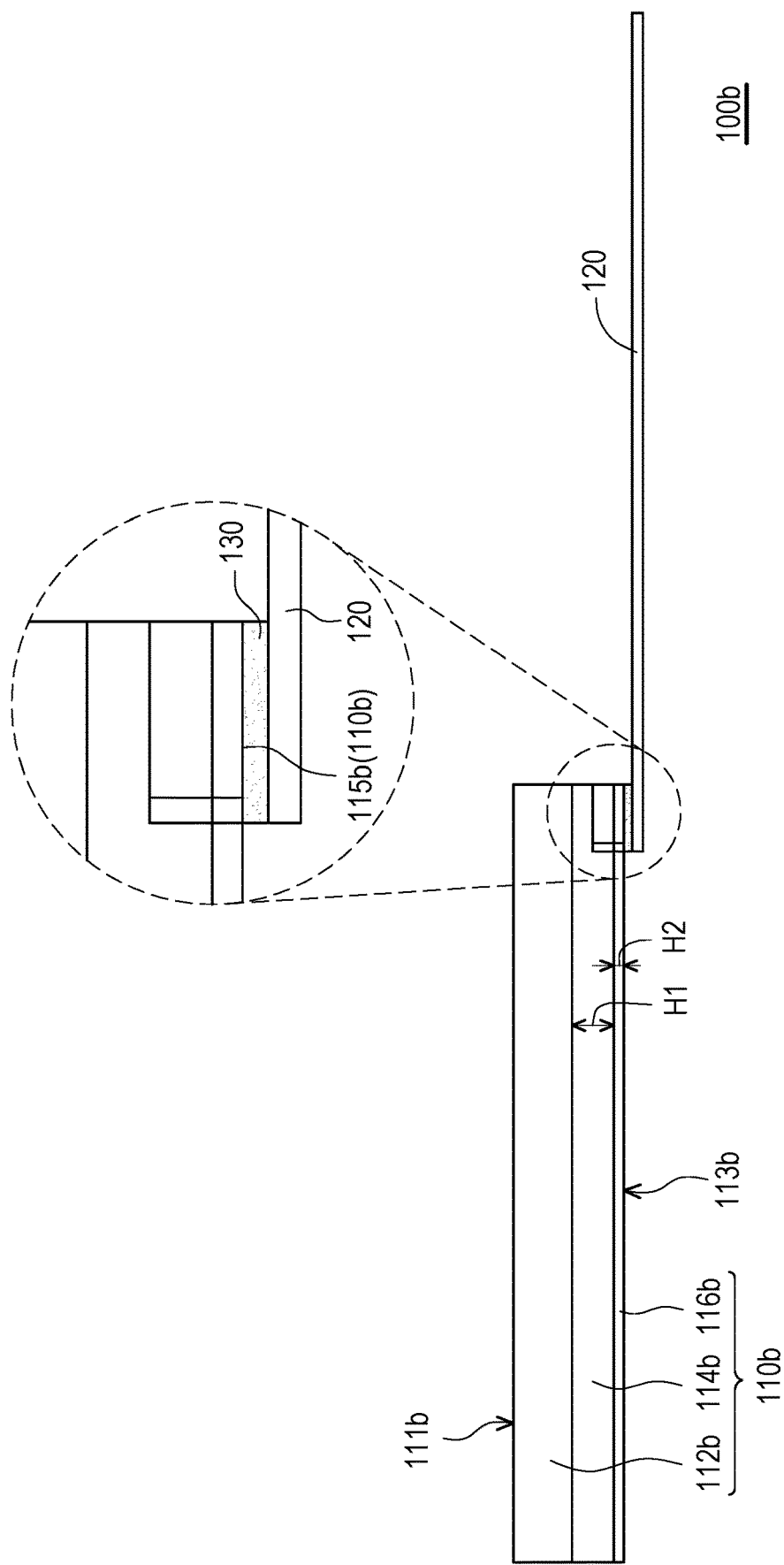
FIG. 2 is a schematic side view of a display device according to another embodiment of the disclosure.

FIG. 2 is a schematic side view of a display device according to another embodiment of the disclosure. Please refer to FIG. 1B and FIG. 2 at the same time. The display device 100b of the embodiment is similar to the above-mentioned display device 100a, and the difference between the two embodiments lies in that the display panel 110b further includes an upper substrate 112b, a first lower substrate 114b and a second lower substrate 116b. The upper substrate 112b has the light-emitting surface 111b, the first lower substrate 114b is located between the second lower substrate 116b and the upper substrate 112b, and the second lower substrate 116b has the back surface 113b. The first lower substrate 114b and the second lower substrate 116b completely overlap the upper substrate 112b. The size of the first lower substrate 114b and the size of the second lower substrate 116b are the same as the size of the upper substrate 112b. Herein, the dimensions include length and width, but the embodiment is not limited thereto.

Please refer to FIG. 2 again. In the present embodiment, a first thickness H1 of the first lower substrate 114b is grated than a second thickness H2 of the second lower substrate 116b. In one embodiment, a first thickness H1 of the first lower substrate 114b, for example, is between 0.3 mm and 0.73 mm. In one embodiment, a second thickness H2 of the second lower substrate 116b, for example, is between 0.05 mm and 0.1 mm. In one embodiment, the first lower substrate 114b and the second lower substrate 116b in this embodiment can be respectively thinned CMOW substrate coated with liquid crystal silicon. In one embodiment, the electrical communication between the first lower substrate 114b and the second lower substrate 116b can be achieved through through silicon vias, but the embodiment is not limited thereto. In one embodiment, the pad 115b can be embedded in the back surface 113b of the second lower substrate 116b. In one embodiment, the pad 115b can be protruded from the back surface 113b of the second lower substrate 116b.

Based on the foregoing, in the design of the display device of the disclosure, the pad of the display panel is disposed on the back surface, and the flexible printed circuit is bonded on the pad and electrically connected to the display panel. Compared with the conventional technology in which the pad of the display panel is disposed on the front surface, the design of the display device according to the embodiments of the disclosure can effectively reduce the size, so that the display device can have a smaller size.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

The invention claimed is:

1. A display device, comprising:
   a display panel comprising a pad and having a light-emitting surface and a back surface opposite to each other, wherein the pad is disposed on the back surface; and
   a flexible printed circuit bonded on the pad of the display panel, wherein the display panel is electrically connected to the flexible printed circuit,
   wherein the display panel further comprising an upper substrate, a first lower substrate and a second lower substrate, the upper substrate has the light-emitting surface, the first lower substrate is located between the second lower substrate and the upper substrate, and the second lower substrate has the back surface, and the first lower substrate and the second lower substrate completely overlap the upper substrate.

2. The display device as claimed in claim 1, wherein the display panel further comprising an upper substrate and a lower substrate, the upper substrate has the light-emitting surface, and the lower substrate has the back surface, and the lower substrate completely overlaps the upper substrate.

3. The display device as claimed in claim 1, wherein a first thickness of the first lower substrate is greater than a second thickness of the second lower substrate.

4. The display device as claimed in claim 3, wherein the first thickness is between 0.3 mm and 0.73 mm.

5. The display device as claimed in claim 3, wherein the second thickness is between 0.05 mm and 0.1 mm.

6. The display device as claimed in claim 1, wherein the pad of the display panel comprises a plurality of terminals separated from each other, and the plurality of terminals extend inwardly by a length from a side edge of the back surface.

7. The display device as claimed in claim 6, wherein the length is between 0.5 mm and 1.5 mm.

8. The display device as claimed in claim 6, wherein a width of each of the plurality of the terminals is between 0.03 mm and 0.15 mm.

9. The display device as claimed in claim 6, wherein a spacing between any two adjacent terminals is between 0.01 mm and 0.05 mm.

10. The display device as claimed in claim 6, wherein the pad of the display panel is spaced apart from an upper edge and a lower edge that are vertically connected to the side edge of the back surface by a distance of 0.2 mm to 0.8 mm, respectively.

11. The display device as claimed in claim 1, wherein the display panel comprises liquid crystal on silicon panel.

12. The display device as claimed in claim 1, further comprising:
   an anisotropic conductive film disposed between the pad of the display panel and the flexible printed circuit, wherein the flexible printed circuit is bonded to and electrically connected to the pad through the anisotropic conductive film.

* * * * *